United States Patent
Lin et al.

(10) Patent No.: US 9,967,942 B1
(45) Date of Patent: May 8, 2018

(54) LIGHT EMITTING DIODE DRIVING SYSTEM AND BURNING METHOD THEREOF

(71) Applicant: Chicony Power Technology Co., Ltd., New Taipei (TW)

(72) Inventors: Chih-Hung Lin, New Taipei (TW); Chao-Wei Tsai, New Taipei (TW); Sung-Wei Wu, New Taipei (TW); Chih-Hsien Chiang, New Taipei (TW); Hung-Ta Shih, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days. days.

(21) Appl. No.: 15/490,886

(22) Filed: Apr. 18, 2017

(30) Foreign Application Priority Data

Feb. 6, 2017 (TW) .............................. 106103826 A

(51) Int. Cl.
*H05B 37/02* (2006.01)
*H05B 33/08* (2006.01)

(52) U.S. Cl.
CPC ................ *H05B 33/0854* (2013.01)

(58) Field of Classification Search
CPC ................................................ H05B 33/0854
USPC ......................................................... 315/158
See application file for complete search history.

(56) References Cited

U.S. PATENT DOCUMENTS

| | | |
|---|---|---|
| 6,175,434 B1 | 1/2001 | Feng |
| 8,575,851 B1 | 11/2013 | Bahrehmand |
| 8,692,483 B2 | 4/2014 | Weng |
| 9,239,941 B1 | 1/2016 | Diorio |
| 9,374,854 B2 | 6/2016 | Quilici et al. |
| 9,445,482 B2 | 9/2016 | Brochu et al. |
| 2008/0265799 A1* | 10/2008 | Sibert ............... H05B 37/0245 315/292 |
| 2013/0175931 A1 | 7/2013 | Sadwick |
| 2013/0293112 A1* | 11/2013 | Reed ................ H05B 33/0863 315/131 |
| 2015/0296598 A1 | 10/2015 | Haid et al. |

(Continued)

FOREIGN PATENT DOCUMENTS

| | | |
|---|---|---|
| CN | 102236345 A | 11/2011 |
| CN | 203482454 U | 3/2014 |
| CN | 104144543 A | 11/2014 |

(Continued)

*Primary Examiner* — Daniel D Chang
(74) *Attorney, Agent, or Firm* — CKC & Partners Co., Ltd.

(57) ABSTRACT

A light emitting diode driving system includes an infrared ray burning device and a light emitting diode driving device. The light emitting diode driving device includes an infrared ray receiving unit, a signal transforming unit, a storage unit, a pulse width modulating unit and a diode driving unit. The infrared ray receiving unit receives a burning signal transmitted by the infrared ray burning device; the signal transforming unit transforms the burning signal into a current control command and transmits it to the storage unit. The signal transforming unit generates a current control signal in accordance with the current control command in the storage unit. The pulse width modulating unit generates a pulse width modulation output current control signal according to the current control signal. The diode driving unit drives the light emitting diode by the pulse width modulation output current control signal.

10 Claims, 3 Drawing Sheets

(56) References Cited

U.S. PATENT DOCUMENTS

2015/0373796 A1    12/2015   Bahrehmand
2016/0316536 A1    10/2016   Oepts et al.

FOREIGN PATENT DOCUMENTS

| CN | 104411042 A | 3/2015 |
| CN | 204316828 U | 5/2015 |
| CN | 205385644 U | 7/2016 |
| TW | I440399 B | 6/2014 |
| TW | I503047 B | 10/2015 |

\* cited by examiner

LIGHT EMITTING DIODE DRIVING SYSTEM AND BURNING METHOD THEREOF

CROSS-REFERENCE TO RELATED APPLICATION

This application claims the priority benefit of Taiwan Application serial no. 106103826, filed Feb. 6, 2017, the full disclosure of which is incorporated herein by reference.

FIELD OF INVENTION

The invention relates to a light emitting diode driving system and burning method thereof. More particularly, the invention relates to a light emitting diode driving system and burning method thereof for burning the output current by infrared ray.

BACKGROUND

Light emitting diodes have many advantages, including lower energy consumption, longer life, better physical durability, smaller size and faster switching speed. In recent years, light emitting diodes have been widely used.

However, in order for the light emitting diode to function properly, it is necessary for the driving device to provide a corresponding driving voltage and driving current. In addition, different driving voltages and/or driving currents are required to be provided to different light emitting diodes. In the process of producing the driving device, if the output current of the driving device is set by different external resistors, when there are many types of light emitting diodes, the output current may be erroneously caused by using the wrong resistance by the production personnel. In addition, producing driving devices also takes a lot of time.

Therefore, how to reduce the time taken to set the output current during the production of the driving device and how to correctly set the output current and reduce the error rate are problems to be improved in the field.

SUMMARY

An embodiment of this disclosure is to provide a light emitting diode driving system. The light emitting diode driving system includes an infrared ray burning device and a light emitting diode driving device. The light emitting diode driving device includes an infrared ray receiving unit, a signal transforming unit, a storage unit, a pulse width modulating unit and a diode driving unit. The infrared ray receiving unit receives a burning signal transmitted by the infrared ray burning device; the signal transforming unit transforms the burning signal into a current control command and transmits it to the storage unit. The signal transforming unit generates a current control signal in accordance with the current control command in the storage unit. The pulse width modulating unit generates a pulse width modulation output current control signal according to the current control signal. The diode driving unit drives the light emitting diode by the pulse width modulation output current control signal.

An embodiment of this disclosure is to provide a light emitting diode driving system burning method. The burning method comprises: sending a burning signal according to one of at least one current setting command; receiving the burning signal; transforming the burning signal into a current control command and transmitting the current control command to a storage unit; generating a current control signal according to the current control command stored in the storage unit; generating a pulse width modulation output current control signal according to the current control signal; and driving a light emitting diode by the pulse width modulation output current control signal.

The embodiment of the present disclosure is to provide a light emitting diode driving system and burning method thereof, and in particular, a light emitting diode driving system and burning method thereof to burn an output current by infrared ray, in order to effectively save the use of resistors when setting the output current and the time cost when preparing a different resistance of the fixture. In addition, the output current of multiples devices may be burned at one time, and it may also avoid the production line to get the wrong resistor to set the current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
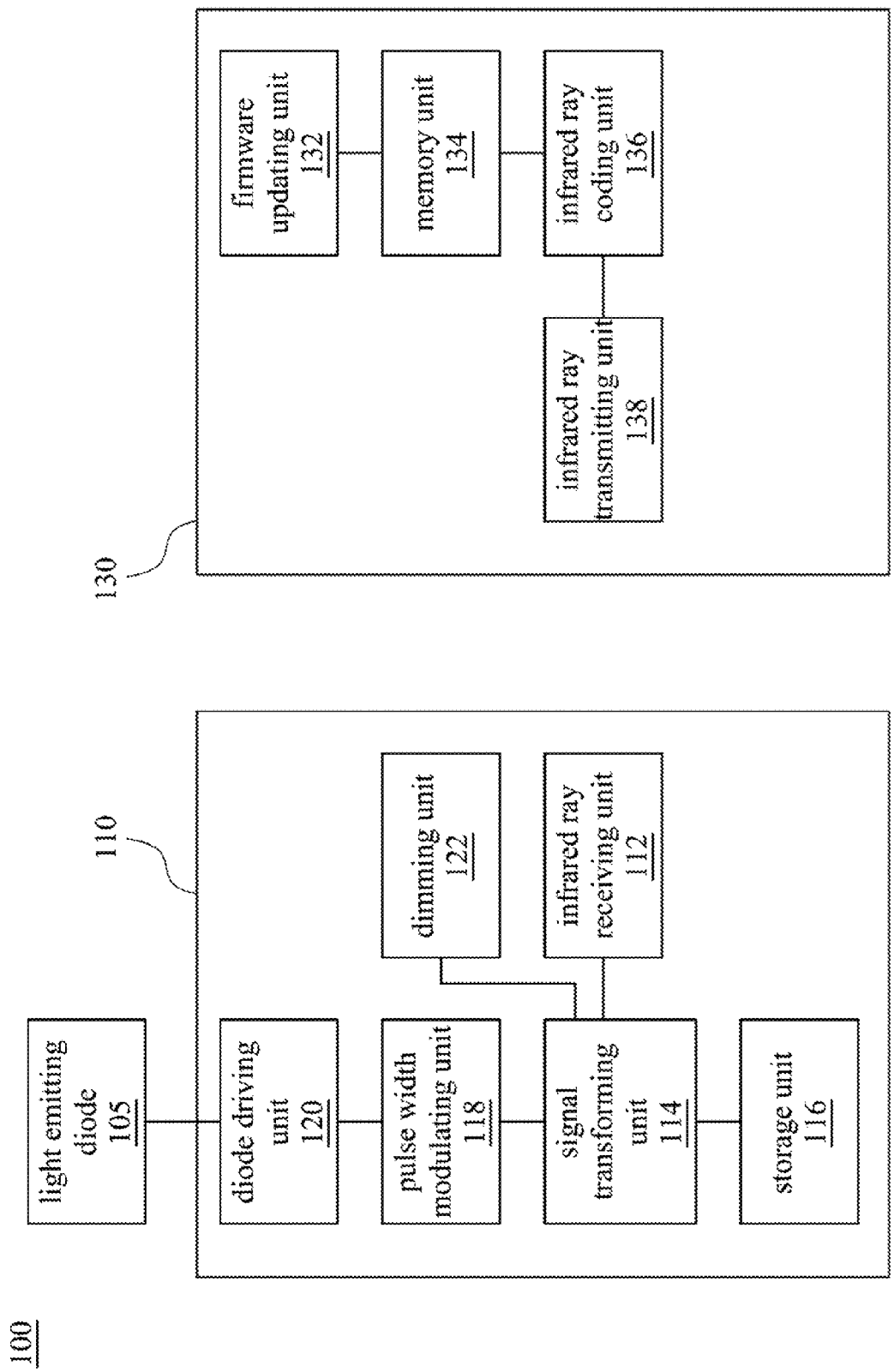
FIG. 1 is a schematic diagram illustrating a light emitting diode driving system according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Reference is made to FIG. 1. FIG. 1 is a schematic diagram illustrating a light emitting diode driving system 100 according to some embodiments of the present disclosure. The light emitting diode driving system 100 includes a light emitting diode driving device 110 and an infrared ray burning device 130. The light emitting diode driving device 110 may be coupled to light emitting diode 105 and drive the light emitting diode 105. The light emitting diode driving system 100 shown in FIG. 1 is for illustrative purposes only and is not limited thereto.

As illustrated in FIG. 1, the light emitting diode driving device 110 includes an infrared ray receiving unit 112, a signal transforming unit 114, a storage unit 116, a pulse width modulating unit 118, and a diode driving unit 120. The signal transforming unit 114 and the infrared ray receiving unit 112 are electrically connected. The storage unit 116 and the signal transforming unit 114 are electrically connected. The pulse width modulating unit 118 and the signal transforming unit 114 are electrically connected. The diode driving unit 120 and the pulse width modulating unit 118 are electrically connected.

As illustrated in FIG. 1, the infrared ray burning device 130 includes a memory unit 134, an infrared ray coding unit 136 and an infrared ray transmitting unit 138. The memory unit 134 is electrically connected to the infrared ray coding unit 136, and the infrared ray coding unit 136 is electrically connected to the infrared ray transmitting unit 138.

For convenience of explanation and understanding, the interoperability of the light emitting diode driving device 110 and the infrared ray burning device 130 will be describe in details in the following paragraphs together with FIG. 2 and FIG. 3.

Figure 2:
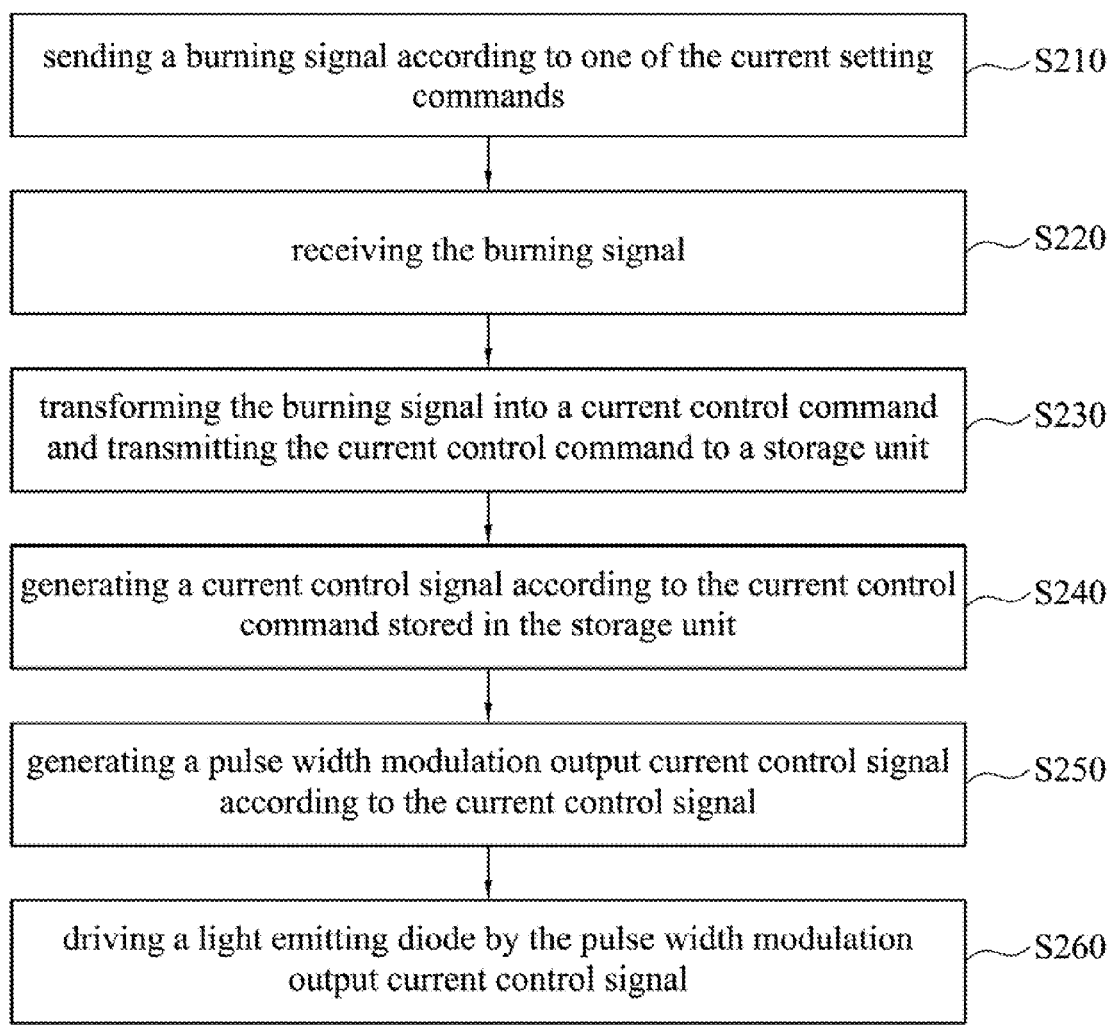
FIG. 2 is a flow chart illustrating a burning method for a light emitting diode driving system according to some embodiments of the present disclosure.

Reference is made to FIG. 2. FIG. 2 is a flow chart of a burning method 200 of a light emitting diode driving system 100 according to some embodiments of the present disclosure. The light emitting diode driving system 200 includes operation S210 to S260.

Reference is made to FIG. 1 and FIG. 2. In operation S210, transmitting the burning signal according to one of the current setting commands. In some embodiments of the present disclosure, operation S210 may be performed by the infrared ray burning device 130. For example, the memory unit 134 stores a plurality of current setting commands, where the current setting commands contain the output current magnitude to be burned into the light emitting diode driving device 110. In operation S210, the infrared ray burning device 130 sends the burning signal according to one of the stored plurality of current setting commands to the light emitting diode driving device 110.

Figure 3:
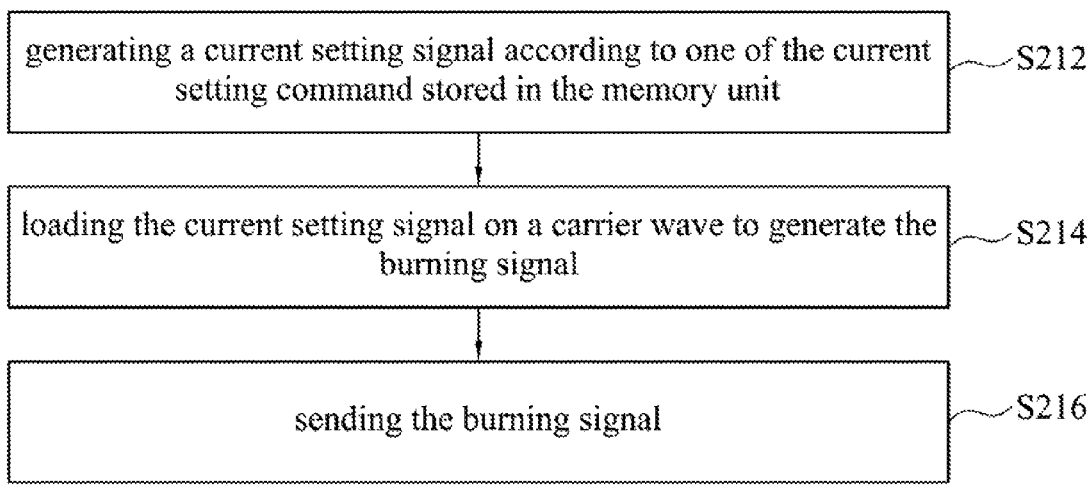
FIG. 3 is a flow chart illustrating one of the operations in the method of FIG. 2 according to some embodiments of the present disclosure.

Reference is made to FIG. 3. FIG. 3 is a flowchart of operation S210 of FIG. 2 according to some embodiments of the present disclosure. Operation S210 includes operations S212 to S216. For convenience of explanation and understanding reference is made to both FIG. 1 and FIG. 3.

In operation S212, generating a current setting signal according to one of the current setting commands stored in the memory unit. In some embodiments of the present disclosure, operation S212 may be performed by the infrared ray coding unit 136. For example, memory unit 134 stores a plurality of current setting commands. The multiple current setting commands are the magnitudes of multiple output currents that may be burned into the light emitting diode driving device 110. Specifically, the current setting commands may be 0.8 amperes, 1 ampere, 2 amperes, and so on. In operation S212, the infrared ray coding unit 136 generates a current setting signal according to one of the current setting commands. For example, the infrared ray coding unit 136 generates the current setting signal according to the current setting command of 2 amperes. The magnitude of the current setting commands described above is for illustrative purposes only and is not limited thereto.

In some embodiments of the present disclosure, the current setting commands are represented by the size of 1 byte. For example, the function of 1 ampere may be designed to be 00000001, the function of 2 amperes may be designed to be 00000010, and so on. Therefore, the size of a 1 byte may contain 256 different current setting commands. The expression of the current setting commands described above is for illustrative purposes only and is not limited thereto.

In some embodiments of the present disclosure, the infrared ray coding unit 136 generates a current setting signal with a Manchester coding combination. For example, lighting for 889 us and stopping lighting for 889 us are represented as 1, and stop lighting for 889 us and lighting for 889 us are represented as 0. The expression of the current setting signal described above is for illustrative purposes only and is not limited thereto.

In operation S214, loading the current setting signal on a carrier wave to generate the burning signal. In some embodiments of the present disclosure, operation S214 may be performed by the infrared ray transmitting unit 138. For example, the infrared ray delivery unit 138 loads the current setting signal transmitted by the infrared ray coding unit 136 on the carrier wave and generates the burning signal. Specifically, the burning signal may contain an output current of 2 amperes. Loading the current setting signal to the carrier wave may reduce the interference of the signal when transmitting.

In operation S216, sending the burning signal. In some embodiments of the present disclosure, operation S216 may be performed by infrared ray delivery unit 138. For example, the infrared ray delivery unit 138 may send a burning signal containing the information of an output current of 2 amperes.

Reference is made to FIG. 2 again. In operation S220, receiving the burning signal. In some embodiments of the present disclosure, operation S220 may be performed by the infrared ray receiving unit 112. For example, the burning signal sent by the infrared ray burning device 130 is received by the infrared ray receiving unit 112.

In operation S230, transforming the burning signal into a current control command and transmitting the current control command to a storage unit. In some embodiments of the present disclosure, operation S230 may be performed by the signal transforming unit 114. For example, signal transforming unit 114 transforms the burn signal into a current control command, and the magnitude of the output current to be burned into the light emitting diode driving driver 110 may be known. Specifically, if the magnitude of the output current to be burned into the light emitting diode driving device 110 included in the burning signal is 2 amperes, the signal transforming unit 114 transforms the burning signal into a current control command, and the signal transforming unit 114 stored the current control command in the storage unit 116. The current control command is the command of 2 amperes of the output current to be burned.

It should be noted that the current control command stored in the storage unit 116 is set and burned during the production process. After the current control command is set and burned, the general user may not change the burned output current magnitude. In other words, only one current control command is stored in storage unit 116. For example, when the output current of the light emitting diode driving device 110 is 2 amperes, only the current control command of 2 amperes is stored in the storage unit 116.

In operation S240, generating a current control signal according to the current control command stored in the storage unit. In some embodiments of the present disclosure, operation S240 may be performed by the signal transforming unit 114. For example, when the current control command is stored in the storage unit 116, the signal transforming unit 114 generates a current control signal according to the current control command in the storage unit 116. Specifically, when the current control command stored in the storage unit 116 is 2 amperes, the signal transforming unit 114 generates the current control signal according to the current control command of the 2 amperes.

In operation S250, generating a pulse width modulation output current control signal according to the current control signal. In some embodiments of the present disclosure, operation S250 may be performed by the pulse width modulating unit 118. For example, when the current control signal is generated according to the current control command of the output current of 2 amperes, the pulse width modulating unit 118 generates a pulse width modulation output current control signal according to the current control signal including output current information of 2 amperes.

In some embodiments of the present disclosure, the pulse width modulation output current control signal is generated in the manner of pulse width modulation. For example, the pulse width modulation output current control signal may be produced by the conducting time being 81% and the non-conducting time being 19%. In other words, the duty cycle may be adjusted to produce pulse width modulation output current control signal. The ratio of the conducting time to the non-conducting time described above is for illustrative purposes only, and the present disclosure is not limited thereto.

In operation S260, driving a light emitting diode by the pulse width modulation output current control signal. In some embodiments of the present disclosure, operation S260 may be performed by the diode driving unit 120. For example, the diode driving unit 120 is electrically connected to the light emitting diode 105, and the diode driving unit 120 drives the light emitting diode 105 according to the pulse width modulation output current control signal transmitted by the pulse width modulating unit 118.

It should be noted that after the light emitting diode driving device 110 has burned in the output current, by each time the user drives the light emitting diode 105, the signal transforming unit 114 will directly read the burned current control command from the storage unit 116. The current control signal is generated from the current control command, and the current control signal is sent to the pulse width modulating unit 118. The pulse width modulating unit 118 may generate the pulse width modulation output current control signal according to the received current control signal, and sent the pulse width modulation output current control signal to the diode driving unit 120. The diode driving unit 120 then drives the light emitting diode 105 according to the received pulse width modulation output current control signal. In addition, the current control command stored in the storage unit 116 is set and burned during the production process, and once the current control command is set and burned, the general user may not change the output current magnitude. In other words, after the production of the light emitting diode driving device 110 is completed and sent out of the factory, the storage unit 116 only stores one current control command. According to this, during the operation of the light emitting diode driving device 110, the light emitting diode driver 110 can only drive the light emitting diode 105 with one kind of brightness.

Reference is made to FIG. 1. In some embodiments of the present disclosure, the infrared ray burning device 130 further includes a firmware updating unit 132 for setting and updating the current setting commands stored in the memory unit 134. For example, the firmware updating unit 132 may set and/or update the current setting command content and/or format stored in the memory unit 134.

In some embodiments of the present disclosure, the light emitting diode driving device 110 further includes a dimming unit 121, which is electrically connected to the signal transforming unit 115. In some embodiments of the present invention, the dimming unit 122 is used to adjust the magnitude of the output current by the user to adjust the brightness of the light emitting diode 105. It should be noted that the user can only adjust the output current magnitude within the range of the burned-in output current magnitude. In other words, the output current burned by the infrared ray burning device 130 is the maximum of the output current of the light emitting diode driving device 110, and the user may only change the output current by the dimming unit 122 within the range of the burned-in maximum of the output current to change the brightness of light emitting diode 105.

When the dimming unit 122 transmits the dimming signal to the signal transforming unit 114, the signal transforming unit 114 combines the current control signal with the dimming signal to generate the current control signal. For example, when the output current burned in the light emitting diode driving device 110 is 2 amperes and the dimming unit 122 sends a dimming signal to the signal transforming unit 114 to perform current adjustment within the range of 2 amperes, the signal transforming unit 114 combines the current control signal with the dimming signal to generate a new current control signal, and the current magnitude is adjusted within the range of 2 amperes of the output current, and the brightness of the light emitting diode 105 is adjusted by the operation of the following circuits. The values included in the current control signal above mentioned are for illustrative purposes only and are not limited thereto.

In some embodiments of the present disclosure, the light emitting diode driving device 110 may be a device or circuit having the function to drive the light emitting diode 105 or other equivalent function. In some embodiments of the present disclosure, the infrared ray burning device 130 may be provided with means or circuitry for setting and transmitting infrared ray information or other equivalent functions. In some embodiments of the present disclosure, the infrared ray receiving unit 112 may be an apparatus or circuit having the function of receiving the infrared ray information or other equivalent functions. In some embodiments of the present disclosure, the signal transforming unit 114 may be an apparatus or circuit having the function of transforming the infrared ray information or other equivalent function.

In some embodiments of the present disclosure, the pulse width modulating unit 118 may be a device or circuit having the function of pulse width modulation or other equivalent function. In some embodiments of the present disclosure, the diode driving unit 118 may be a device or circuit having the function of driving diodes or other equivalent function. In some embodiments of the present disclosure, the storage unit 116 and the memory unit 134 may be storage devices having the function of storing data or other equivalent functions. In some embodiments of the present invention, the infrared ray coding unit 136 may be an apparatus or circuit having the function of coding an infrared code or other equivalent function. In some embodiments of the present disclosure, the infrared ray sending unit 138 may be an apparatus or circuit having the function of sending the infrared information or other equivalent functions.

According to the embodiment of the present disclosure, it is understood that the embodiment of the present disclosure is to provide a light emitting diode driving system and burning method thereof, and in particular, a light emitting diode driving system and burning method thereof to burn an output current by infrared ray, in order to effectively save the use of resistors when setting the output current and the time cost when preparing a different resistance of the fixture. In addition, the output current of multiples devices may be burned at one time, and it may also avoid the production line to get the wrong resistor to set the current.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light emitting diode driving system, comprising:
   an infrared ray burning device; and
   a light emitting diode driving device configured to drive a light emitting diode, wherein the light emitting diode driving device comprises:
      an infrared ray receiving unit configured to receive a burning signal transmitted by the infrared ray burning device;
      a signal transforming unit electrically coupled with the infrared ray receiving unit;
      a storage unit electrically coupled with the signal transforming unit;
      a pulse width modulating unit electrically coupled with the signal transforming unit; and
      a diode driving unit electrically coupled with the pulse width modulating unit;
   wherein the signal transforming unit transforms the burning signal into a current control command and transmits the current control command to store in the storage unit; the signal transforming unit generates a current control signal according to the current control command stored in the storage unit and transmits the current control signal to the pulse width modulating unit; the pulse width modulating unit generates a pulse width modulation output current control signal according to the current control signal received by the pulse width modulating unit and transmits the pulse width modulation output current control signal to the diode driving unit; and the diode driving unit drives the light emitting diode by the pulse width modulation output current control signal;
   wherein the current control command comprises a magnitude of an output current to be burned into the light emitting diode driving driver.

2. The light emitting diode driving system of claim 1, wherein the infrared ray burning device comprises:
   a memory unit configured to store at least one current setting command;
   an infrared ray coding unit configured to generate a current setting signal according to one of the at least one current setting command in the memory unit; and
   an infrared ray transmitting unit configured to load the current setting signal on a carrier wave to generate the burning signal and transmit the burning signal to the infrared ray receiving unit.

3. The light emitting diode driving system of claim 2, wherein the infrared ray coding unit generates the current setting signal by a Manchester coding combination.

4. The light emitting diode driving system of claim 2, wherein the infrared ray burning device further comprises:
   a firmware updating unit configured to set and update the at least one current setting command stored in the memory unit.

5. The light emitting diode driving system of claim 1, wherein the light emitting diode driving device further comprises:
   a dimming unit electrically connected with the signal transforming unit;
   wherein when the dimming unit transmits a dimming signal to the signal transforming unit, the signal transforming unit combines the current control signal with the dimming signal to generate the current control signal.

6. A light emitting diode driving system burning method, comprising:
   sending a burning signal according to one of at least one current setting command;
   receiving the burning signal;
   transforming the burning signal into a current control command and transmitting the current control command to a storage unit for storing;
   generating a current control signal according to the current control command stored in the storage unit;
   generating a pulse width modulation output current control signal according to the current control signal; and
   driving a light emitting diode by the pulse width modulation output current control signal;
   wherein the current control command comprises a magnitude of an output current to be burned into the light emitting diode driving driver.

7. The light emitting diode driving system burning method of claim 6, wherein sending the burning signal comprises:
   generating a current setting signal according to one of the at least one current setting command stored in a memory unit;
   loading the current setting signal on a carrier wave to generate the burning signal; and
   sending the burning signal.

8. The light emitting diode driving system burning method of claim 7, wherein generating the current setting signal comprises:
   generating the current setting signal by a Manchester coding combination.

9. The light emitting diode driving system burning method of claim 7, further comprising:
  setting and updating the at least one current setting command stored in the memory unit by a firmware updating unit.

10. The light emitting diode driving system burning method of claim 6, further comprising:
  generating a dimming signal by a dimming unit; and
  generating the current control signal by combining the current control signal with the dimming signal.

* * * * *